Dec. 16, 1958 R. D. LOHMAN ET AL 2,864,961

TRANSISTOR ELECTRONIC SWITCH

Filed Sept. 3, 1954

INVENTORS
Robert D. Lohman &
Gerald B. Herzog
BY H. L. Newton
ATTORNEY

United States Patent Office 2,864,961

Patented Dec. 16, 1958

2,864,961

TRANSISTOR ELECTRONIC SWITCH

Robert D. Lohman, Princeton Junction, and Gerald B. Herzog, New Brunswick, N. J., assignors to Radio Corporation of America, a corporation of Delaware Application September 3, 1954, Serial No. 454,176

16 Claims. (Cl. 307—88.5)

Figure 1:
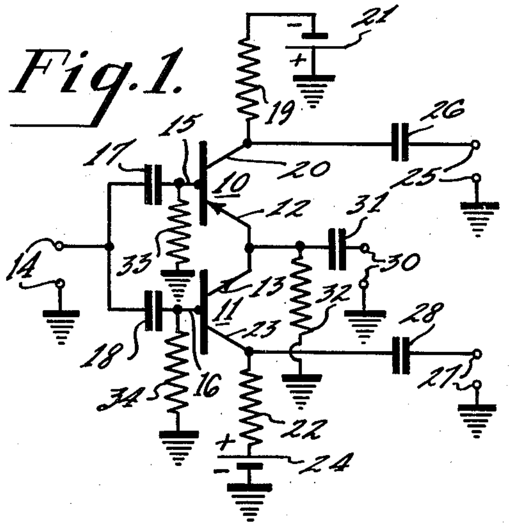

The present invention relates generally to electric switching circuits, and particularly to electronic switching circuits utilizing semiconductor devices.

It is frequently desired to provide switching means which may be controlled electronically to select any one of several signal conveying circuits or channels or to select electronically one of several signal conveying circuits or channels to convey a given signal.

Such functions are frequently necessary in computor circuits or in television receiving systems wherein complex signal waves must be selected on a time basis to provide individual output signals of a predetermined characteristic to establish certain control functions in the system. In the past it has been necessary usually to provide several stages of control in order satisfactorily to select signals or channels for these purposes.

One such type of selection circuit is commonly referred to as a diode logic circuit utilizing perhaps a number of diode devices or unilaterally conducting devices which must be biased respectively to provide different predetermined desired functions. These circuits though utilizing simple devices become extremely complex in order to provide the complex functions desired.

Other examples of circuitry previously utilized to provide these functions may be found in the electron tube art wherein again multiple stages or devices have previously been required to provide the desired functions.

Another example of an information selecting device or system is that disclosed by Rajchman et al. in U. S. Patent 2,666,151, issued January 12, 1954, for Magnetic Switch Device. The system therein disclosed by Rajchman utilizes magnetic devices connected in a matrix wherein information may be stored and selected by proper activation of individual magnetic devices within the matrix.

Accordingly, it is an object of the present invention to provide an improved electronic switching circuit which may utilize semiconductor devices to simplify the circuit structure.

It is a further object of the present invention, to provide an improved electronic switch capable of selecting a single signal conveying channel from a plurality of such channels to convey predetermined signal information available from one or more sources.

It is still another object of the present invention, to provide an electronic switch which effectively may utilize semiconductor devices of opposite conductivity type for electronically selecting a predetermined signal from a plurality of signal sources and applying the selected signal to a single signal conveying circuit or channel.

It is a further object of the present invention to provide an improved electronic switch which effectively may utilize semiconductor devices of opposite conductivity types for selecting any one of a predetermined number of channels for conveying signal information or for selecting signal information from any one of a predetermined number of signal conveying circuits or channels.

In accordance with a preferred embodiment of the present invention, a pair of semiconductor devices of opposite conductivity types are arranged in an electronic switching circuit wherein a first pair of like electrodes of the devices are connected in common and utilized as control electrodes and a second pair of like electrodes may be connected in common and utilized as either input electrodes or output electrodes. The third pair of like electrodes are then utilized, depending on the function of the second pair of like electrodes, as the output or input electrodes for a plurality of signal conveying channels or circuits.

Figure 2:
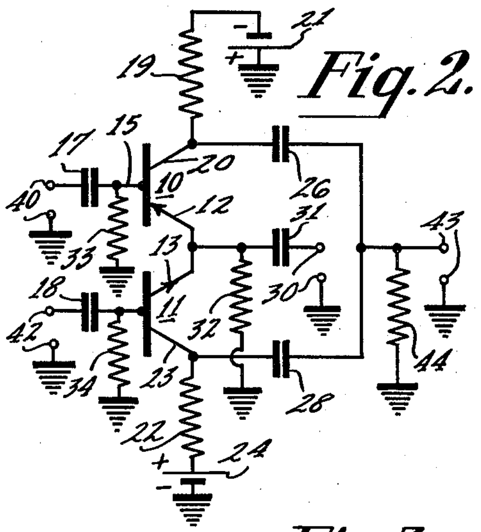
Figure 4:
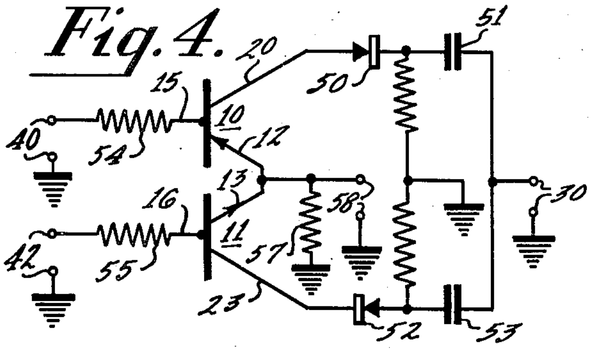
Figure 3:
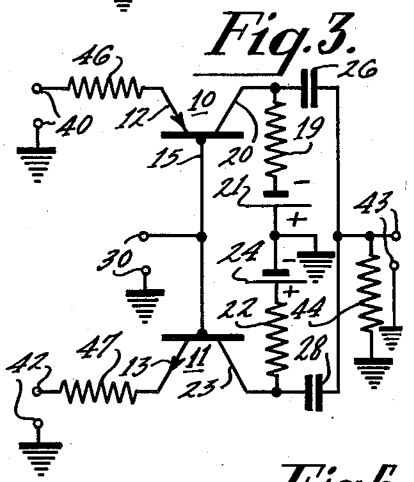
Figure 6:
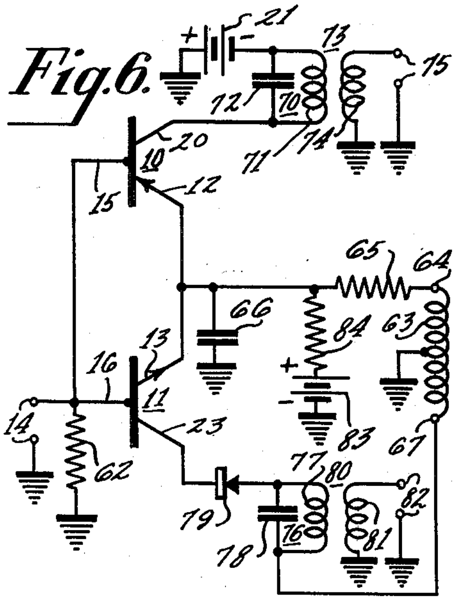
Figure 5:
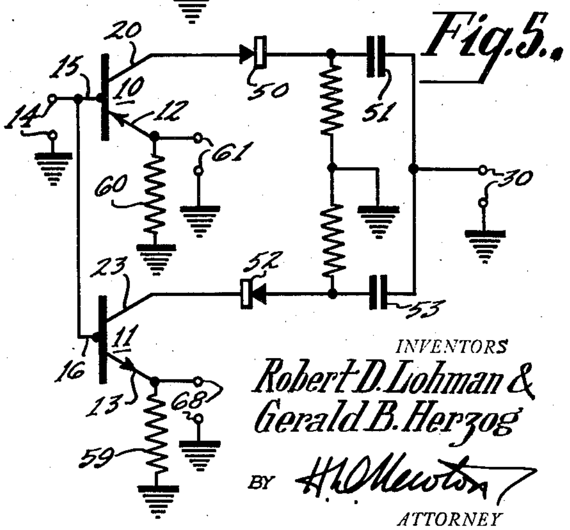

The novel features that are considered characteristic of this invention are set forth with particularity in the the appended claims. The invention itself however, both as to its organization and method of operation, as well as additional objects and advantages thereof, will best be understood from the following description when read in connection with the accompanying drawing, in which:

Figures 1, 5 and 6 are schematic circuit diagrams of electronic switching circuits embodying the present invention wherein a common input circuit may electronically be switched to one of a plurality of output circuits; and Figures 2, 3 and 4 are schematic circuit diagrams of electronic switching circuits in accordance with the present invention wherein one of a plurality of input channels or circuits may electronically be selected and connected with a common output circuit.

Referring now to the drawing wherein like elements have been designated by the same reference characters throughout the various figures, and particularly to Figure 1, a pair of semiconductor devices or transistors 10 and 11 of opposite conductivity types are connected with their respective emitter electrodes 12 and 13 in common. It is to be noted that the transistors 10 and 11 are illustrated as PNP and NPN semiconductor devices respectively. This is for the purpose of illustration only and is not to be taken as a limitation on the invention. If, however, the conductivity type of the transistors 10 and 11 were reversed the switching functions which are to be later described hereinafter, would also be reversed and the polarity of the biasing sources provided would be, in a like manner, reversed.

Input signals from any convenient source may be connected to a pair of input terminals 14 for the switching circuit, one of which is connected to signal ground the other of which is connected to each of the base electrodes 15 and 16 through coupling capacitors 17 and 18 respectively.

The output circuit for the transistor 10 includes a collector electrode load resistor 19 which is connected between the collector electrode 20 and a source of operating bias illustrated as a battery 21. The positive terminal of the battery 21 is connected to ground. In a like manner, the output circuit for the transistor 11 includes a load resistor 22 which is connected between the collector electrode 23 and a source of operating bias illustrated as a battery 24. The negative terminal of the battery 24 is connected to ground.

Output signals may be derived from the collector electrode 20 of the transistor 10 across a pair of output terminals 25 for the switching circuit one of which is coupled to the collector electrode 20 through a coupling capacitor 26 the other of which is connected to signal ground. Output signals may be derived from the collector electrode of the transistor 11 across a pair of output terminals 27 for the switching circuit one of which is connected to the collector electrode 23 through a coupling capacitor 28 the other of which is connected to signal ground.

The control circuit for the electronic switch includes a pair of control terminals 30 one of which is connected to the junction of the emitter electrodes 12 and 13 through a coupling capacitor 31 the other of which is connected to signal ground. A direct current return for the emitter electrodes 12 and 13 is provided by means of a common emitter resistor 32 which is connected between the two emitter electrodes 12 and 13 and signal ground. A direct current path for the base electrode currents is provided by a pair of base resistors 33 and 34 connected between ground and the respective base electrodes 15 and 16.

As to the operation of the circuit, it is readily seen that if the characteristics of the two transistors 10 and 11 are identical but opposite in polarity, a common direct current will flow from the battery 24 through the load resistor 22, the transistor 11, the transistor 10, the load resistor 19 to the battery 21 and back to the battery 24 through ground. If, however, there is any difference in the conductive characteristics of the two devices the emitter and collector currents of the devices will differ and the difference current will flow through the common emitter resistor 32 to provide the balancing current for the devices. If the devices are equal in their characteristics the emitter electrodes 12 and 13 will be essentially at ground potential. If there is any difference in their characteristics the emitter electrodes 12 and 13 will naturally assume a direct current voltage which will be positive or negative with respect to ground depending on which of the transistors tends to carry the heaviest bias current.

It is also readily seen that the application of a positive going control pulse or signal to the control terminals 30 will cause the transistor 10 to conduct more heavily and at the same time will cause the transistor 11 to conduct less heavily. The amplitude of the pulse, if sufficient, may result in cutting off the transistor 11. Conversely the application of a negative going control pulse or signal to the control terminals 30 will produce an opposite reaction on the two transistors, that is, it will tend to cause the transistor 11 to conduct more heavily and will cause the transistor 10 to conduct less heavily. It then becomes apparent that if an input signal is applied to the input terminals 14 and a control signal is applied to the control terminals 30, the instantaneous polarity of the control signal will determine which of the two output circuits will be functional to provide the output signal which is an amplified version of the input signal. If a positive going signal is applied to the control terminals 30, an output signal will be derived from the output terminals 25. If a negative going signal is applied to the control terminals 30 an output signal will be derived from the output terminals 27.

The exact character of the output signal will be dependent somewhat upon the frequency relationship existing between the input signal and the control signal. If the control signal is in the nature of a square-wave pulse the output signal will be essentially the wave-form provided by the input signal. If, however, the control signal is of a higher frequency than the frequency of the input signal, the output signal will be in the nature of an amplitude modulated wave wherein the control signal will represent the carrier wave and the input signal will represent the envelope modulations of the wave.

The schematic circuit diagram in Figure 1 illustrates one aspect of the present invention wherein a given signal may be electronically conveyed to one of a plurality of output channels. In Figure 2 a pair of transistors 10 and 11 are adapted to connect one of two input channels to a common output channel. Accordingly, a first input circuit includes a first pair of input terminals 40 for the switching circuit one of which is connected to the base electrode 15 through the coupling capacitor 17 the other of which is connected to signal ground; and a second input channel includes a second pair of input terminals 42 for the switching circuit one of which is connected to the base electrode 16 through the coupling capacitor 18 the other of which is connected to signal ground. A common output circuit includes a pair of output terminals 43 for the switching circuit, one of which is connected to the collector electrodes 20 and 23 through the coupling capacitors 26 and 28 respectively, and the other of which is connected to signal ground. A common load impedance element illustrated as a resistor 44 is provided across the output terminals 43.

The operation of the circuit of Figure 2 is essentially identical with the operation of the circuit shown in Figure 1, except that the input circuit is selected by means of the control signal which may be applied to the control terminals 30. Accordingly, if a positive going control pulse is applied to the control terminals 30 the transistor 10 will be effective to couple the input terminals 40 to the output terminals 43 thereby providing signal translation. If, on the other hand, a negative going control pulse is applied to the control terminals 30 the transistor 11 will be effective in connecting the input terminals 42 to the output terminals 43 providing signal translation for the second channel.

It is, of course, within the purview of the present invention to provide an emitter input circuit for the transistors 10 and 11 as is illustrated in Figure 3. The function of the circuit illustrated in Figure 3 is substantially identical with that illustrated in Figure 2. However, in this instance an emitter input circuit is utilized for each of the transistors 10 and 11 as contrasted with the base input circuit utilized in Figure 2.

Accordingly, an emitter resistor 46 is connected between one of the first pair of input terminals 40 and the emitter electrode 12, and an emitter resistor 47 is connected between one of the second pair of input terminals 42 and the emitter electrode 13. The control signals may be applied to the control terminals 30, one of which is connected in common with the base electrodes 15 and 16, and the other of which is connected to signal ground. However, since the control signals are applied to the base electrodes instead of the emitter electrodes it is evident that the polarity of the control function will be reversed with respect to that encountered in Figures 1 and 2. Accordingly, a positive going control signal when applied to the control electrodes 30 will cause the transistor 11 to become more conductive and to convey signals from the second pair of input terminals 42 to the output terminals 43 while, at the same time cutting off or isolating the first pair of input terminals 40 from the output terminals 43. A negative going control signal will conversely provide signal translation between the first pair of input terminals 40 and the output terminals 43. It is readily seen therefore that the type of transistor operation as desired may be selected and the circuit connected accordingly.

In another form of the present invention, as illustrated in Figure 4, the control signal may be applied to the collector electrodes 20 and 23 from a pair of control terminals 30. Accordingly, one of the pair of control terminals 30 is connected to the collector electrode 20 by the series arrangement of an isolating diode 50 and a coupling capacitor 51. A second diode 52 and a second coupling capacitor 53 are connected in series arrangement between the collector electrode 23 and the aforementioned one of the control terminals 30. The other of the pair of control terminals 30 is connected directly to signal ground.

Input signals may be applied to the transistor 10 from a pair of input terminals 40 one of which is connected to the base electrode 15 by the base resistor 54 the other of which is connected directly to signal ground. In a like manner input signals may be applied from a second signal source to the transistor 11 from a second pair of input terminals 42 one of which is connected to the base electrode 16 through a base resistor 55 the other of which is connected directly to signal ground.

A common load circuit is provided by a load impedance element illustrated as a resistor 57 which is connected in common between the emitter electrodes 12 and 13 and signal ground. An amplified replica of either of the input signals may be derived from a pair of output terminals 58 connected across the load resistor 57.

The operation of the circuit illustrated in Figure 4 is substantially identical with the operation of the circuit illustrated in Figure 3. Input signals which may be applied from any convenient source may be connected individually to each of the two input circuits provided. The application of control signals to the control terminals 30 will determine, depending on the instantaneous polarity of the control signal, which of the two input signals will appear at the output terminals 58. Accordingly, a negative going control signal will provide transistor action for the transistor 10, thereby providing effective signal translation from the input terminals 40 to the output terminals 58.

It is noted that the isolating diodes 50 and 52 are poled in such a direction as to prevent the application of a control signal to a collector electrode except control signals of an appropriate polarity to bias that collector electrode in such a direction to provide transistor action. It is well known that the semiconductor devices are bidirectional devices. Accordingly, a control signal having a polarity opposite to that normally applied to a collector electrode would, if applied to that electrode tend to cause that electrode to act as an emitter electrode thereby allowing signal translation through the device. The isolating diodes are effective to prevent this occurrence. Accordingly, only one of the transistors 10 and 11 may, at any given instant, provide signal translation.

The schematic circuit diagram shown in Figure 5 illustrates a further embodiment of the present invention wherein input signals from a single signal source may be applied in common to the base electrodes 15 and 16 from a pair of input terminals 14, and one of a pair of output circuits may be selected by the application of a control signal to the collector electrodes 20 and 23 as discussed in connection with Figure 4. Accordingly, a first output circuit is provided by means of a load impedance element illustrated as a load resistor 60 connected between the emitter electrode 12 and signal ground. An output signal may be derived from a first pair of output terminals 61 which are connected across the load resistor 60.

A second output circuit is provided by means of a second load impedance element illustrated as a resistor 59 connected between the emitter electrode 13 and signal ground. Output signals may be derived from a second pair of output terminals 68 one of which is connected to the emitter electrode 13, the other of which is connected directly to signal ground.

As to the operation of the embodiment of the invention illustrated in Figure 5, it is believed to be apparent that the functions of selecting one of two or more signal channels to convey information from a single source may be conveniently selected by the application of appropriate control signals to the control terminals 30, as above discussed in connection with Figure 1. However, in the present embodiment of the invention the control signals are applied to the collector electrodes through the isolating diodes as discussed in connection with Figure 4, thereby selecting which of the two emitter output circuits will be utilized for the purpose of signal translation.

It is the present practice, in order to insure proper operation of the various circuit components in a color television receiver system, to transmit a composite signal which includes, in addition to the video signals comprising brightness and color information, the usual horizontal and vertical synchronizing signals and also bursts of several cycles each of the color subcarrier wave, interspersed at predetermined periodic intervals normally chosen to respectively follow the horizontal synchronizing signals.

It therefore becomes necessary in a color television receiver system to select these bursts of the color subcarrier wave from the composite video signal on a time basis. This may be readily accomplished by utilizing the flyback pulses available at the horizontal output transformer as control pulses for the electronic switch provided by the present invention. Such a system is illustrated in Figure 6 wherein a pair of transistors 10 and 11 are arranged in an electronic switch circuit similar to that illustrated in Figure 1.

Accordingly, the composite video signal may be applied to the base electrodes 15 and 16 from a pair of input terminals 14 one of which is at signal ground. A base electrode resistor 62 is connected between signal ground and the base electrodes 15 and 16 to provide a direct current return path therefore. Control signals may be derived from a winding 63 which may represent a winding on a horizontal output transformer. Accordingly, one terminal 64 of the winding 63 is connected through a resistor 65 to the emitter electrodes 12 and 13, thereby applying to the emitter electrodes a control signal in the form of a horizontal flyback pulse.

A first output circuit is provided by means of a parallel resonant tuned circuit 70 comprising an inductor 71 and a capacitor 72. The parallel resonant tuned circuit may be tuned to provide effective signal transmission for signal energy between 2 and 4 megacycles. This circuit is connected between the collector electrode 20 and the negative terminals of a source of energy potential illustrated as a battery 21. The positive terminal of the battery 21 is connected directly to ground. The inductor 71 may comprise the primary winding of a coupling transformer 73 which further includes a secondary winding 74, one terminal of which is connected to one of a pair of output terminals 75. The other terminal of the winding 74 and the other of the pair of output terminals 75 are connected directly to ground. Accordingly, the output terminals 75 may be connected to the chrominance channel in a color television receiving system to be further operated upon and to ultimately provide the chrominance information for the color kinescope.

A second output circuit may be provided by a second parallel resonant tuned circuit 76 comprising an inductor 77 and a parallel connected capacitor 78 which are tuned to the frequency of the color sub-carrier, which is presently considered to be 3.58 megacycles. The parallel resonant circuit 76 is connected in series with an isolating diode 79 between the collector electrode 23 and the other terminal 67 of the winding 63.

The inductor 77 may comprise the primary winding of an output transformer 80 which further includes a secondary winding 81. The secondary winding may be connected by means of the output terminals 82 to the color hold circuit in a color television receiving system, thereby applying to the color hold circuits, at appropriate intervals, the bursts of the color sub-carrier wave in order to synchronize the local oscillator in the color hold circuit.

Further direct current operating bias for the transistors 10 and 11 is provided from a source of direct current potential, illustrated as a battery 83 and a current limiting resistor 84 which are connected in series between the emitter electrodes 12 and 13 and ground. The bias conditions for the transistors 10 and 11 are accordingly, such as to provide, under static conditions, transistor action through the transistor 10 while maintaining the transistor 11 in a cut-off condition. It is then apparent that signal translation will be provided between the input terminals 14 and the first pair of output terminals 75 under static conditions, or in the absence of a control signal which may be applied to the emitter electrodes 12 and 13 to overcome this static bias condition.

It may thus be seen that if a composite video signal is applied to the input terminals 14, the flyback pulses which are derived from the winding 63 will be effective as control pulses to apply appropriate bias to the emitter electrodes 12 and 13 to provide transistor action in the transistor 11 at such times as to make the bursts of the sub-carrier wave available at the output terminals 82 in appropriate time relationship. Pulses of a negative polarity are derived from the upper terminals of the winding 63 at a time when the burst of the color sub-carrier wave appear in the composite video signal. These negative pulses are applied to the emitter electrodes 12 and 13 to effectively cut-off the transistor 10 and to bias the base and emitter electrodes of the transistor 11 in a forward direction. Simultaneously, a positive pulse which is derived from the lower terminal of the winding 63 is applied to the collector electrode 23, which provides the proper bias for transistor action. Accordingly, the application of these pulses is effective to provide signal translation through the transistor 11 to the color hold circuit of the television receiving system while preventing the translation of signal energy to the chrominance channel.

When these pulses are not available at the winding 63, the static bias conditions of the circuit are appropriate to provide signal translation from the input terminals 14 to the chrominance channel as above discussed.

It is accordingly apparent that the electronic switching circuit provided by the present invention may be effectively utilized to electronically select one of a plurality of input signals to be applied to a given output channel, or to select one of a plurality of output channels to convey a given input signal. This may be accomplished while utilizing semiconductor devices of opposite conductivity types in common emitter, common base or common collector circuits. The control signal may be applied to the emitter or collector electrodes as desired. The present invention accordingly affords a simple, efficient and dependable electronic switch for the selection of signal information on a time basis, or the selection of signal conveying channels.

We claim:

1. An electronically controllable switching circuit comprising, in combination, a pair of semiconductor devices of opposite conductivity types each having an input and an output electrode and each arranged to selectively provide a separate signal path between the input electrodes of said devices and the output electrodes of said devices, an input circuit coupled in common with each of said input electrodes, an output circuit coupled with each of said output electrodes, control means separate from said input and output electrodes coupled with said devices for selectively and simultaneously biasing one of said devices in a conductive state and the other of said devices in a non-conductive state, whereby only one of said pair of semiconductor devices is conductive at any given instant to provide signal translation between said input circuit and a selected one of said output circuits.

2. An electronic switching circuit comprising, in combination, a pair of semiconductor devices of opposite conductivity types each connected in a separate signal translating path and each including input, output and common electrodes, an input circuit coupled in common between said input and common electrodes, separate output circuits coupled between the output and common electrodes of each of said pair of semiconductor devices respectively, and a control circuit separate from said input and output electrodes and connected in common with said common electrodes for selectively biasing one of said devices in a conductive state and simultaneously biasing the other of said pair of devices in a non-conductive state.

3. An electronic switching circuit as defined in claim 2, wherein said input electrodes are base electrodes, said common electrodes are emitter electrodes and said output electrodes are collector electrodes.

4. An electronic switching circuit as defined in claim 2, wherein said input electrodes are emitter electrodes, said common electrodes are base electrodes and said output electrodes are collector electrodes.

5. An electronic switching circuit as defined in claim 2, wherein said input electrodes are base electrodes, said common electrodes are collector electrodes and said output electrodes are emitter electrodes.

6. An electronic switching circuit comprising, in combination, a pair of semiconductor devices of opposite conductivity types each including input, output and common electrodes, an input circuit coupled between the input and common electrodes of one of said pair of semiconductor devices, another input circuit independent of the first-mentioned input circuit and coupled between the input and common electrodes of the other of said pair, an output circuit coupled in common between said output and common electrodes, and a control circuit connected in common with said common electrodes for selectively controlling signal translation through one of said pair of semiconductor devices.

7. An electronic switching circuit as defined in claim 6, wherein said input electrodes are base electrodes, said common electrodes are emitter electrodes and said output electrodes are collector electrodes.

8. An electronic switching circuit as defined in claim 6, wherein said input electrodes are emitter electrodes, said common electrodes are base electrodes and said output electrodes are collector electrodes.

9. An electronic switching circuit as defined in claim 6, wherein said input electrodes are base electrodes, said common electrodes are collector electrodes and said output electrodes are emitter electrodes.

10. An electronically controllable switching circuit comprising, in combination, a pair of semiconductor devices of opposite conductivity types, each of said devices including a semiconductive body having base, emitter and collector electrodes associated therewith, separate biasing means respectively for said collector electrodes for applying a static reverse bias of a predetermined magnitude between each of said collector and base electrodes, a first input circuit connected with the base electrode of one of said pair of devices for applying a first signal wave thereto, a second input circuit independent of said first input circuit connected with the base electrode of the other of said pair of devices for applying a second signal wave thereto, signal output circuit means coupled in common with said collector electrodes, control means connected with said emitter electrodes for selectively and simultaneously applying reverse bias between the base and emitter electrodes of one of said pair of devices and a forward bias between the base and emitter electrodes of the other of said devices, whereby said pair of semiconductor devices are selectively biased to a conductive state to provide signal translation for one of said input signals selectively between one of said input circuits and said output circuit.

11. An electronically controllable switching circuit comprising in combination, a pair of semiconductor devices of opposite conductivity types arranged in separate signal translating paths, each of said devices including a semiconductive body having base, emitter and collector electrodes associated therewith, bias means connected with said devices for applying a reverse bias between each collector electrode and the respective base electrode, an input circuit connected to apply a predetermined signal wave to said base electrodes, a first output circuit connected with one of said collector electrodes, a second output circuit connected with the other of said collector electrodes, a separate control means connected with said emitter electrodes for selectively applying a reverse bias between the base and emitter electrodes of one of said devices and a forward bias between the base and emitter electrodes of the other of said devices, whereby said pair of semiconductor devices are selectively biased to a conductive state to provide signal translation of said signal wave between said input circuit and one of said output circuits.

12. An electronic switching circuit comprising in combination, a pair of semiconductor devices of opposite conductivity types each arranged to provide a separate signal translating path and each including base, emitter and collector electrodes, bias means for biasing one of said pair of devices in a normally conductive state and for biasing the other of said devices in a normally non-conductive state, said base electrodes being connected in common, said emitter electrodes being connected in common, an input circuit connected between said base and emitter electrodes, a frequency selective output circuit connected between the collector and emitter electrodes of each of said pair of semiconductor devices, and a control circuit separate from said input circuit and connected with said emitter electrodes for applying a control bias of a polarity and magnitude to overcome said means, whereby said one of said devices is rendered conductive and non-conductive alternately and said other of said devices is rendered correspondingly conductive and non-conductive alternately at preselected control intervals.

13. An electronically controllable switching circuit comprising, in combination, a pair of semiconductor devices of opposite conductivity types, each of said devices including a semiconductive body having base, emitter and collector electrodes associated therewith, an input circuit connected with said base electrodes for applying a signal wave thereto, a first output circuit coupled to one of said emitter electrodes, a second output circuit coupled to the other of said emitter electrodes, a source of direct current bias and a load resistor connected with said collector electrodes for applying a static reverse bias of a predetermined magnitude between each of said collector and base electrodes, control means separate from said input and output circuits for selectively applying a control signal of a polarity and magnitude to overcome said static bias on one of said pair of devices, unilaterally conducting devices connected between said control means and said collector electrodes, said unilaterally conducting devices being poled in a direction to prevent the application of a forward bias between the said collector and base electrodes, whereby said pair of semiconductor devices are alternately biased to a conductive state to provide signal translation for said input signal between said input circuit and one of said output circuits.

14. An electronically controllable signal switching circuit comprising, in combination with signal input and output terminals for said switching circuit, a pair of semiconductor devices of opposite conductivity types each arranged to provide a separate signal translation path between said input and output terminals, control means separate from said input and output terminals and coupled with said pair of devices for effectively biasing one of said pair of devices in a conductive state in response to a control signal and for simultaneously biasing the other of said pair of devices in a nonconductive state, whereby only one of said pair of semiconductor devices is conductive to provide signal translation between said input and said output terminals.

15. An electronically controllable switching circuit comprising, in combination with signal input and output terminals for said switching circuit, a pair of semiconductor devices of opposite conductivity types each connected to provide through said devices signal translation between said input and output terminals, control means separate from said input and output terminals and coupled with said devices for simultaneously biasing one of said devices in a conductive state and the other of said devices in a nonconductive state in response to a control signal, whereby only one of said pair of semiconductor devices is conductive to provide signal translation between said input and said output terminals.

16. An electronic switching circuit comprising, in combination, a pair of semiconductor devices of opposite conductivity types, each of said devices having input, output and common electrodes, a first input circuit coupled between the input and common electrodes of one of said pair of devices, a second input circuit independent of said first input circuit and coupled between the input and common electrodes of the other of said pair of devices, an output circuit coupled in common between said output and common electrodes, and a control means connected with said common electrodes for applying control pulses thereto, whereby signals applied to said input circuits are selectively switched through said devices to said output circuit.

References Cited in the file of this patent

UNITED STATES PATENTS

| | | |
|---|---|---|
| 2,663,800 | Herzog | Dec. 22, 1953 |
| 2,698,386 | Eberhard et al. | Dec. 28, 1954 |
| 2,722,649 | Immel et al. | Nov. 1, 1955 |
| 2,763,832 | Shockley | Sept. 18, 1956 |
| 2,770,728 | Herzog | Nov. 13, 1956 |